(12) United States Patent
Kess

(10) Patent No.: US 7,372,345 B2
(45) Date of Patent: May 13, 2008

(54) CIRCUIT FOR CONNECTION OF AT LEAST TWO SIGNAL SOURCES WITH AT LEAST ONE SIGNAL OUTPUT

(75) Inventor: Helmut Kess, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 134 days.

(21) Appl. No.: 11/191,307

(22) Filed: Jul. 28, 2005

(65) Prior Publication Data

US 2006/0028292 A1 Feb. 9, 2006

(30) Foreign Application Priority Data

Jul. 28, 2004 (DE) ...................... 10 2004 036 489

(51) Int. Cl.
*H01P 1/15* (2006.01)
(52) U.S. Cl. ...................... 333/103; 333/104
(58) Field of Classification Search ................ 333/101, 333/103, 104, 262
See application file for complete search history.

(56) References Cited

U.S. PATENT DOCUMENTS

| 4,959,873 | A | * | 9/1990 | Flynn et al. ................. 455/303 |
| 5,274,343 | A | * | 12/1993 | Russell et al. ............... 333/103 |
| 6,452,374 | B1 | | 9/2002 | Kreischer |
| 6,677,755 | B2 | | 1/2004 | Belt et al. |
| 7,030,614 | B2 | | 4/2006 | Matschl et al. |
| 2003/0107453 | A1 | * | 6/2003 | Kenington .................. 333/101 |
| 2005/0206439 | A1 | * | 9/2005 | Struble ....................... 327/427 |

\* cited by examiner

*Primary Examiner*—Benny Lee
(74) *Attorney, Agent, or Firm*—Schiff Harin LLP

(57) ABSTRACT

In a circuit for connection of at least two signal sources with at least one signal output, the signal sources are connected with a control unit. The control unit activates or deactivates the signal sources by transmission of control signals. Each signal source is connected with a blocking unit. Each blocking unit is connected with the control unit. The blocking unit can block or enable a connection between the signal source and the signal output, with the connection being automatically enabled when the signal source is activated.

12 Claims, 2 Drawing Sheets

CIRCUIT FOR CONNECTION OF AT LEAST TWO SIGNAL SOURCES WITH AT LEAST ONE SIGNAL OUTPUT

BACKGROUND OF THE INVENTION

1. Field of the Invention

The present invention concerns a circuit for connection of at least two signal sources with at least one signal output, the signal sources being connected to a control unit that activates or deactivates the signal sources via transmission of control signals.

2. Description of the Prior Art

In the transmission of electrical signals from signal sources to a signal output that, for example, is connected to a signal evaluation unit, it is frequently necessary to selectively connect a number of signal sources with only one signal evaluation unit. This is in particular the case in magnetic resonance apparatuses where it is necessary to connect a large number of surface coils with a lesser number of preamplifiers. It is additionally necessary that only a few or only one single surface coil are/is active at the same time in order to prevent crosstalk from the other surface coils. The large number of surface coils is, for example, advantageous when a larger region of a patient is to be examined without intrusion into the examination space. The use of larger coils is disadvantageous because, in this case, the signal-to-noise ratio is significantly smaller in comparison to smaller coils. In most magnetic resonance apparatuses, the number of the preamplifiers that are connected with the surface coils is the limiting factor for the number of usable surface coils. Should a large number of smaller coils be used, these must be selectively connected with the preamplifier inputs.

A circuit is known from U.S. Pat. No. 6,677,755 by means of which a number of coils can be connected with preamplifiers of a magnetic resonance apparatus. For this purpose, a switching matrix composed of radio-frequency switches is controlled via a control line by a switch controller, so the coils can be selectively connected with the preamplifiers. The coils can be activated or deactivated by a coil control unit. A disadvantage of this known circuit is its high circuit complexity.

SUMMARY OF THE INVENTION

An object of the present invention is to provide a simple circuit for connection of at least two signal sources with at least one signal output.

The above object is achieved in accordance with the present invention by a circuit for connecting at least two signal sources with at least one signal output having a control unit connected to the signal sources that activates or deactivates the signal sources by the transmission of control signals, wherein each signal source has a blocking unit connected thereto, each blocking unit also being connected with said control unit, each blocking unit being switchable to block or to enable a connection between the signal source to which it is connected and the signal output, with the blocking unit automatically enabling such a connection with the signal source to which it is connected is activated.

The blocking units block or enable the respective connection between the signal source and the signal output. The appropriate connection of the signal source with the signal output is also simultaneously enabled by the control signals of the control unit that serve for activation and deactivation of the signal sources. No separate switch controller is necessary, which allows a lower circuit complexity.

In an advantageous embodiment of the invention, the circuit has at least one primary line that is connected with the signal output and with which each signal source is connected via a secondary (branch) line. This design is particularly simple to execute since here a plurality of signal sources can be connected with the signal output with low circuit complexity.

In a further embodiment, the blocking unit has at least one blocking element (impedance). This can be, for example, a controllable switch. Respective lines between the signal source and the signal output can be blocked or enabled in a simple manner via the switch.

In another embodiment, at least one blocking element is arranged in the stub between the signal source and the primary line. Given a deactivated signal source, the stub can be disconnected from the primary line by means of this blocking element, such that no signals can flow therein.

In a further embodiment, at least one blocking element is connected in the primary line between a connection point of the primary line with the stub for the first signal source and a connection point of the primary line with the stub for the second signal source. Parts of the primary line can therewith also be partially disconnected from the signal path. For example, if the signal source lying closer to the signal output (with regard to the signal path) is activated, the blocking element allows the unused part of the primary line, for the connection point of the primary line with the stub, for the deactivated signal source to be cut off. Particularly for radio-frequency electrical signals, it is important to have no unused stub since, for example, reflections can occur that lead to unwanted signal alterations.

Preferably the blocking elements are PIN diodes. High resistances in the conductors, which effectively disconnect the lines, can be achieved in a simple manner by control signals by means of such PIN diodes.

DESCRIPTION OF THE PREFERRED EMBODIMENTS

Figure 1:
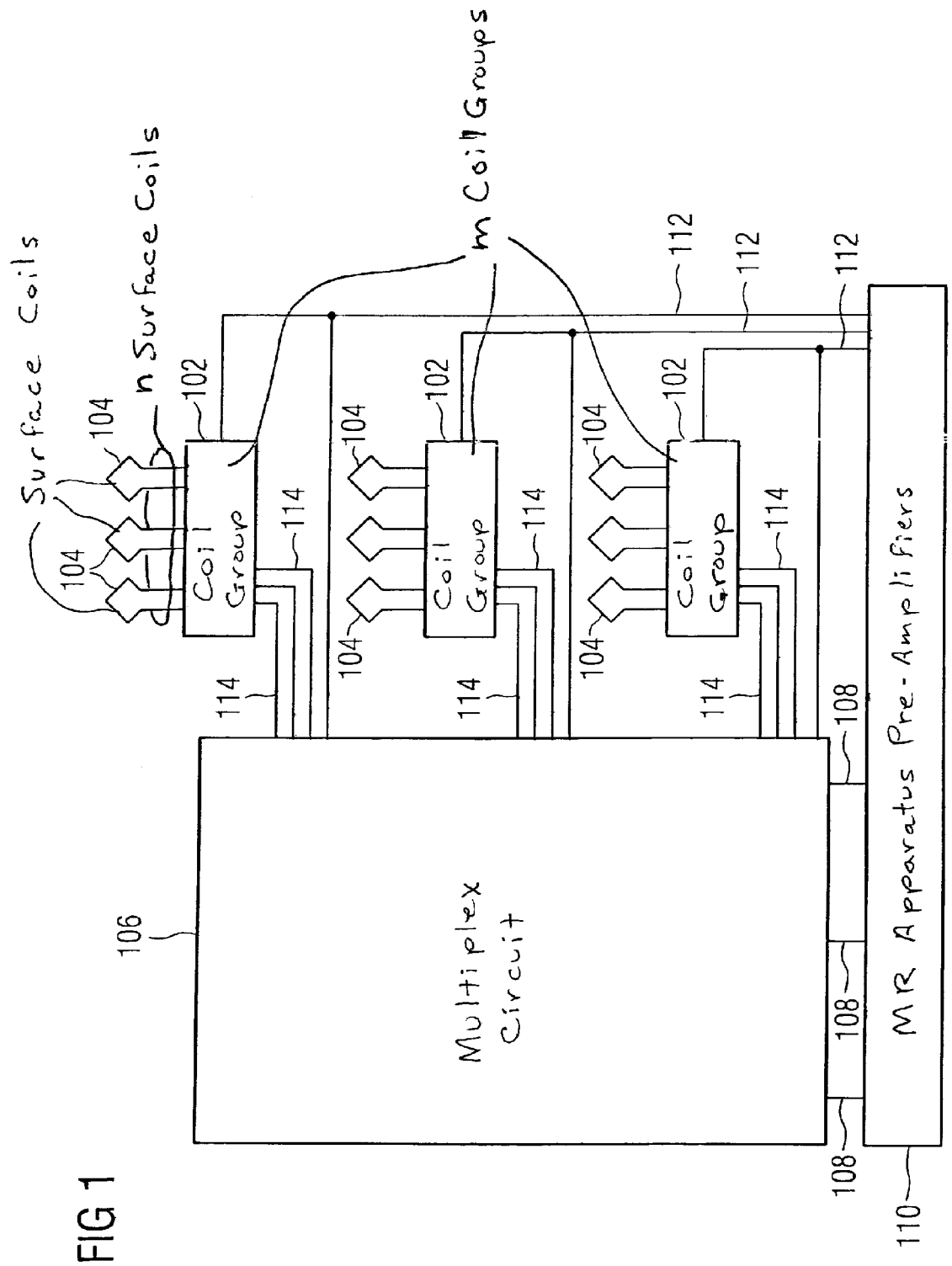
FIG. 1 schematically illustrates a system for reception of magnetic resonance signals with a preferred embodiment of the invention.

The system schematically shown in FIG. 1 has m coil groups 102 (m being an integer), of which three are shown. Each coil group 102 has n surface coils 104 (n being an integer) for the reception of magnetic resonance signals. Again only three surface coils 104 are shown. The surface coils 104 of the coil group 102 are connected with n signal outputs 108 (of which three are likewise shown) by a multiplex circuit 106. The multiplex circuit 106 is a preferred embodiment of the invention and is further explained in detail below using FIG. 2. The n signal outputs 108 are connected with n preamplifiers of a magnetic resonance apparatus 110, with the preamplifiers of the magnetic resonance apparatus 110 being shown only as a single block. Since the number of surface coils 104 of a coil group 102 is equal to the number of preamplifiers, magnetic resonance signals can be acquired with any complete coil group 102. For this purpose, the n surface coils 104 thereof are tuned to the corresponding frequency of the magnetic resonance signals. During the measurement with one coil group 102, the surface coils 104 of all other coil groups 102 are detuned so that they receive no magnetic resonance signals. The tuning and detuning of the coil groups 102 occurs by means of m control lines 112 that proceed from the magnetic resonance apparatus 110 to the m coil groups 102. The m coil groups 102 can be tuned or detuned by defined voltage signals on the control lines 112. For transfer of the acquired magnetic resonance signals, each coil group 102 is connected via a coaxial cable 114 with the multiplex circuit 106 that, during the signal acquisition, connects the respective surface coils 104 of the tuned coil group 102 with the signal outputs 108. At the same time, all untuned coil groups 102 are disconnected (isolated) from the signal outputs 108 so that no interfering signals can emanate from them. The voltage signals of the control lines 112 are used for connection and disconnection of the coil groups 102, which is why the multiplex circuit 106 is connected with the control lines 112.

Figure 2:
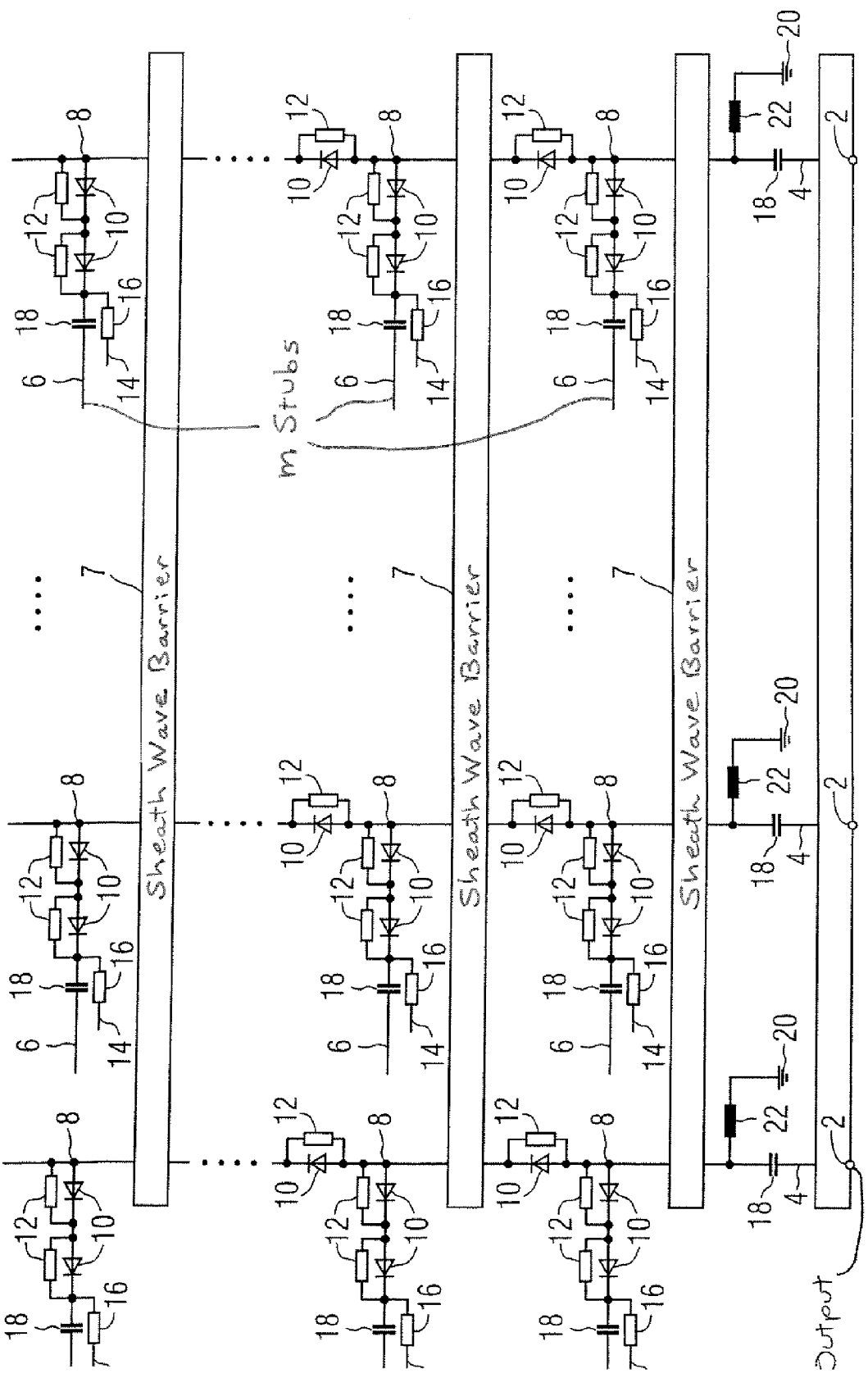
FIG. 2 is a preferred embodiment of the circuit of the invention.

The design of the multiplex circuit is schematically shown in FIG. 2. All lines are executed as coaxial cables with a characteristic impedance of 50 Ω. Of the n signal outputs 2, only three are shown for clarity. The signal outputs 2 are respectively connected with a primary line 4. Branching from each primary line 4 are m stubs 6 (m being an integer), of which again only three are shown. The ends of the stubs 6 are connected with the surface coils of the coil groups. A surface coil of each coil group is thereby connected with each primary line 4. All stubs 6 in the same horizontal row in FIG. 2 consequently form the connections to a coil group. Sheath wave barriers 7 that prevent the propagation of interfering sheath waves are connected in the primary lines 4 between the stubs 6.

The design of one primary line 4 with the corresponding stubs 6 is described in the following; all further primary lines 4 are designed in an analogous manner. A PIN diode 10 of the type BA592 with a resistor 12 of 20 KΩ connected in parallel therewith is located between the connection points 8 of the stubs 6. Two PIN diodes 10 switched in series are located in each stub 6 with a respective resistor 12 connected in parallel with each PIN diode 10. The voltage signals of the control lines are coupled into the circuit via an auxiliary connection 14. A pre-resistor 16 of 5 kΩ is located between the stub 6 and the connection to the control unit. The PIN diodes 10 in the stubs 6 can be switched into the blocking state upon application of a positive voltage on the auxiliary line 14 and are switched to a conducting state upon application of a negative voltage. The pin diodes 10 for all stubs 6 in the same horizontal row are identically polarized so they can be activated with the same control signal. A capacitor 18 of 1 nF, which brings the control signals to a defined ground potential, is additionally located in the stub 6. A capacitor 18 that separates the radio-frequency signal and control signal is likewise located in each primary line 4. A connection to a reference potential 20 branching from the primary line 4 is provided via an inductor 22 of 5 µH. A group of surface coils of the control unit is now activated by the application of a negative voltage, thus the PIN diodes 10 located in the respective stub 6 are simultaneously switched to conduct by the same control signal so that the measured signals of the surface coils arrive at the primary line 4 from the stub 6. The PIN diodes 10 located in the primary line 4 between the respective connection point 8 and the signal output 2 are switched to a conducting state by the same voltage signal. All further coil groups are simultaneously deactivated by a control signal that serves as a deactivation signal for the surface coils. The PIN diodes 10 are thereby switched into the high-ohmic state in the respective stubs 6 to the coils, such that the surface coils are disconnected from the primary line 4. At the same time all PIN diodes 10 in the primary line 4 that are located (viewed from the signal output 2) behind the connection point 8 to the activated coil are switched into the high-ohmic state so that the subsequent parts of the primary line 4 are disconnected from the signal path. This prevents reflections in the signal and thus reduces the possibility of measurement errors.

A connection of many surface coils with one signal output can be achieved with low circuit complexity with the specified circuit. The control signals serve to tune selected surface coils to the frequency of the magnetic resonance signals to be received and at the same time they are used to open the corresponding signal path. The surface coils which should not be receiving are detuned by corresponding control signals so that no reception occurs at the reception frequency. At the same time, the signal paths to these surface coils are blocked by the control signals. In contrast to circuits known in the prior art, no auxiliary signals for control of the switches are consequently necessary.

Although modifications and changes may be suggested by those skilled in the art, it is the intention of the inventor to embody within the patent warranted hereon all changes and modifications as reasonably and properly come within the scope of his contribution to the art.

I claim as my invention:

1. A circuit comprising:
    at least two signal sources;
    a signal output;
    a control unit, connected to each of said signal sources, that emits a control signal to selectively activate or deactivate the respective signal sources;
    each signal source having a corresponding blocking unit electrically connected thereto, each blocking unit also being connected to said control unit and being switchable between a blocking state, which blocks a connection between the corresponding signal source to which the blocking unit is connected and said signal output, and an enabling state that enables said connection between said corresponding signal source to which the blocking unit is connected and said signal output, each blocking unit being switched to said enabling state by said control signal when the corresponding signal source to which the blocking unit is connected is activated by said control signal;
    a primary electrical line connected to said signal output; and
    a plurality of stub lines via which the respective signal sources are connected to said primary line, with a first of said at least two signal sources being connected to said primary line with a first of said plurality of stub lines, a second of said signal sources being connected to said primary line with a second of said plurality of stub lines, said first of said stub lines being connected to said primary line at a first connection point and said second of said stub lines being connected to said primary line at a second connection point, and the blocking unit connected to the second of said at least two signal sources comprising at least one blocking element connected between said first connection point and said second connection point.

2. A circuit as claimed in claim 1 wherein said control unit activates only one of said at least two signal sources at any given time.

3. A circuit as claimed in claim 1 wherein said control unit generates a control voltage as said control signal.

4. A circuit as claimed in claim 1 wherein each blocking unit, other than the blocking unit connected to the second of said at least two signal sources, comprises at least one electrical blocking element electrically connected between the stub line, in said plurality of stub lines, to which the blocking unit is correspondingly connected, and the signal source, among said at least two signal sources, to which the blocking unit is correspondingly connected.

5. A circuit as claimed in claim 1 wherein each blocking unit, other than the blocking unit connected to the second of said at least two signal sources, comprises a series circuit of electrical blocking elements electrically connected between the stub line, in said plurality of stub lines, to which the blocking unit is correspondingly connected, and the signal source, among said at least two signal sources, to which the blocking unit is correspondingly connected.

6. A circuit as claimed in claim 1 wherein at least one of said signal sources comprises a surface coil for receiving a magnetic resonance signal.

7. A circuit as claimed in claim 1 wherein each blocking unit, other than the blocking unit connected to the second of said at least two signal sources, comprises at least one blocking element.

8. A circuit as claimed in claim 7 wherein each blocking unit comprises at least one resistor connected in series with said at least one blocking element.

9. A circuit as claimed in claim 1 wherein each blocking unit comprises a series circuit of a plurality of blocking elements.

10. A circuit as claimed in claim 1 wherein each blocking unit comprises a PIN diode as a blocking element.

11. A circuit as claimed in claim 10 wherein the respective PIN diodes of the corresponding blocking units are identically polarized.

12. A circuit as claimed in claim 10 wherein each blocking unit further comprises a resistor connected in parallel with said PIN diode.

\* \* \* \* \*